(12) United States Patent
Kwon

(10) Patent No.: US 7,879,671 B2
(45) Date of Patent: Feb. 1, 2011

(54) METHOD FOR MANUFACTURING A SEMICONDUCTOR DEVICE THAT IS LESS PRONE TO DC FAILURES BROUGHT ABOUT BY UNWANTED DEFECTS ON CAPACITORS THEREIN

(75) Inventor: Hyuk Kwon, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/492,324

(22) Filed: Jun. 26, 2009

(65) Prior Publication Data
US 2010/0285652 A1   Nov. 11, 2010

(30) Foreign Application Priority Data
May 11, 2009   (KR) .................. 10-2009-0040738

(51) Int. Cl.
*H01L 21/8234* (2006.01)
(52) U.S. Cl. .............. 438/238; 438/239; 438/253; 438/254; 438/396; 257/E27.084; 257/E21.008

(58) Field of Classification Search .............. 438/238, 438/239, 244, 253, 254, 396
See application file for complete search history.

(56) References Cited

U.S. PATENT DOCUMENTS 7,361,598 B2 *   4/2008   Yoon ...................... 438/689

* cited by examiner

*Primary Examiner*—Hsien-ming Lee
(74) *Attorney, Agent, or Firm*—Ladas & Parry LLP

(57) ABSTRACT

A method for manufacturing a semiconductor device that is less prone to DC failures brought about by unwanted defects on capacitors in the device is presented. Manufacturing defects such as scratches are known to occur when making capacitors and that these defects are thought to be a primary cause of subsequent performance DC failures in the completed semiconductor devices. The method includes the steps of depositing, removing, forming, polishing, etching and forming. A sacrificial layer is exploited to allow a subsequent polishing down step to mechanically remove defects from the capacitors.

15 Claims, 6 Drawing Sheets

METHOD FOR MANUFACTURING A SEMICONDUCTOR DEVICE THAT IS LESS PRONE TO DC FAILURES BROUGHT ABOUT BY UNWANTED DEFECTS ON CAPACITORS THEREIN

CROSS-REFERENCE TO RELATED APPLICATIONS

The present application claims priority to Korean patent application number 10-2009-0040738 filed on May 11, 2009, which is incorporated herein by reference in its entirety.

BACKGROUND OF THE INVENTION

The present invention relates to a method for manufacturing a semiconductor device, and more particularly, to a method for manufacturing a semiconductor device which can aid in removing defects produced when forming capacitors and thereby protect against various DC failures.

In high integration configurations of DRAM (dynamic random access memory) semiconductor devices, a great deal of effort has been expended to secure adequate space for the capacitors within the confines of the diminutive compact cells.

Generally these methods of compacting the capacitors capacity have included using extremely high dielectric constant materials for the interfacial dielectric layer of the capacitors, decreasing the thickness of the dielectric layer of capacitor, and/or increasing the effective area of a storage electrode of capacitor.

Among these methods, increasing the effective area of a storage electrode is most commonly chosen option to increase the capacity given the restricted choice of the existing dielectric material and the physical limitations on how thick the dielectric layer can be.

Usually, increasing the effective area of a storage electrode involves designing a three-dimension shape, such as a cylinder, and extending the height of this three-dimension shape to increase the area of the storage electrode.

FIGS. 1 through 4 depict sectional views illustrating some of the more conventional methods for manufacturing a semiconductor device and explaining problems caused therein.

Referring now to FIG. 1, a first interlayer dielectric 11 is shown formed on a substrate 10 which has a cell region CELL and a peripheral region PERI. Storage node contacts 12 are formed through the first interlayer dielectric 11 and electrically couple with the substrate 10 in the cell region CELL.

While not shown in the drawing, it is understood that the substrate 10 can include any number of various underlying structures such as an isolation layer, gates, bit lines, and so forth.

In succession, storage electrodes 13 are formed on the storage node contacts 12 in the shape of cylinders. A dielectric layer 14 and a plate electrode 15 are deposited in the cell region CELL including the storage electrodes 13 and in the peripheral region PERI, and then, the plate electrode 15 and the dielectric layer 14 which are formed in the peripheral region PERI are removed. As a consequence, capacitors, each of which is composed of the storage electrode 13, the dielectric layer 14 and the plate electrode 15, are formed within the cell region CELL.

Next, a second interlayer dielectric 16 is formed in the cell region CELL and the peripheral region PERI.

Due to the presence of the capacitors formed in the cell region CELL, the second interlayer dielectric 16 is formed such that it has a step portion between the cell region CELL and the peripheral region PERI.

Referring now to FIG. 2, the second interlayer dielectric 16 is subsequently planarized by for instance being polished down using a CMP (chemical mechanical polishing) planarizing process.

Referring now to FIG. 3, a contact plug 17 is formed through the second and first interlayer dielectrics 16 and 11 in the peripheral region PERI to be electrically coupled to the substrate 10. A metal layer is then formed in the cell region CELL and the peripheral region PERI, and metal lines 18 are subsequently formed by selectively patterning the metal layer using a photolithographic process.

In the conventional method, a problem can arise in that the defects DEFECT are prone to being produced subsequent to forming the capacitors by being exposed when conducting the CMP process that planarizes the second interlayer dielectric 16. As a result, short circuits, i.e., DC failures, can occur between the capacitors and the metal lines 18 or between various metal lines 18 due to these defects DEFECT. Furthermore the CMP process can produce scratches on the surface of the second interlayer dielectric 16 in which the subsequently deposited metal layer can preserve these scratches. The metal line 18 made from the deposited metal layer having the preserved scratches can also result in producing unwanted short circuits, i.e., DC failures, between the various metal lines 18.

In order to protect against these types of DC failures, a method, as shown in FIG. 4, has been proposed in which a third interlayer dielectric 19 is additionally formed on the second interlayer dielectric 16 after the CMP process is used to planarize the second interlayer dielectric 16.

However, in this third interlayer dielectric method, the third interlayer dielectric 19 results in the need to heighten the contact plug 17 formed in the peripheral region PERI, and as a result the resistance of the contact plug 17 is prone to increasing. Further, when defining a contact hole for forming the contact plug 17 through etching, the contact hole is likely to be insufficiently opened, whereby the reliability of a semiconductor device can deteriorate.

BRIEF SUMMARY OF THE INVENTION

Embodiments of the present invention are directed to a method for manufacturing a semiconductor device which can protect against defects from being produced when forming capacitors, thereby protecting against DC failures brought about by unwanted short circuits between capacitors and metal lines and/or between metal lines.

Also embodiments of the present invention are directed to a method for manufacturing a semiconductor device which can protect against DC failures caused by unwanted short circuits between metal lines in which the metal layer used to form the metal lines preserved CMP produced scratches.

Further embodiments of the present invention are directed to a method for manufacturing a semiconductor device which can protect against increasing the resistance of contact plugs and protect against contact holes from being insufficiently opened due to increase in the height of an interlayer dielectric.

In one embodiment of the present invention, a method for manufacturing a semiconductor device comprises the steps of depositing capacitors and a sacrificial layer in a cell region of a substrate which has the cell region and a peripheral region; forming a first interlayer dielectric in the cell region and the peripheral region; conducting a polishing process using the sacrificial layer as a barrier, and thereby removing defects which are produced on the capacitors and/or the sacrificial layer when forming the capacitors and planarizing the first interlayer dielectric in the peripheral region; removing the sacrificial layer; and forming a second interlayer dielectric in the cell region and the peripheral region.

After the step of removing the sacrificial layer, the method further comprises the step of partially etching the first interlayer dielectric in the peripheral region, and thereby removing a step portion which is formed between the cell region and the peripheral region due to removal of the sacrificial layer.

The step of partially etching the first interlayer dielectric is implemented by using a wet etching process or a dry etching process.

The wet etching process is conducted using an etching solution containing BOE or HF.

The step of depositing the capacitors and the sacrificial layer in the cell region comprises the steps of forming storages nodes of the capacitors in the cell region; depositing a dielectric layer, a plate electrode layer and the sacrificial layer in the cell region and the peripheral region; and removing the sacrificial layer, the plate electrode layer and the dielectric layer in the peripheral region.

The sacrificial layer is formed of a material that has different etching selectivity from a plate electrode of the capacitors.

The sacrificial layer comprises at least one of a tungsten layer, a titanium nitride layer and a titanium layer.

The polishing process comprises a CMP process.

The polishing process is conducted such that the defects produced on the sacrificial layer are substantially removed by being polished.

The polishing process is conducted such that a portion of the sacrificial layer which protrudes due to the presence of the defects produced on the capacitors is substantially removed by being polished and the defects exposed due to removal of the portion of the sacrificial layer are substantially removed.

The step of removing the sacrificial layer is implemented by using a wet etching process or a dry etching process.

The wet etching process is conducted using an etching solution containing SC-1 or piranha solution treatment.

After the step of forming the second interlayer dielectric, the method further comprises the steps of forming a contact plug through the second and first interlayer dielectrics in the peripheral region to be electrically connected with the substrate; and forming metal lines on the second interlayer dielectric in the cell region and the peripheral region.

DESCRIPTION OF SPECIFIC EMBODIMENT

In the present invention, a sacrificial layer is formed on capacitors, and a polishing process is conducted using the sacrificial layer as a barrier so that defects produced while forming the capacitors are removed. Therefore, it is possible to largely prevent against DC failure from being caused in that short circuits occur between the capacitors and metal lines or between metal lines due to the presence of defects.

Also, since the metal lines are formed on an interlayer dielectric which is not CMPed (chemically and mechanically polished), it is possible to substantially prevent against DC failures from being caused in that short circuits occur between the metal lines because a metal layer used to form the metal lines remains in the scratches produced while conducting a CMP process.

Further, since it is not necessary to increase the height of the interlayer dielectric so as to substantially avoid DC failures, it is possible to substantially prevent the resistance of contact plugs from increasing and contact holes from being insufficiently opened due to increase in the height of the interlayer dielectric.

Hereafter, a specific embodiment of the present invention will be described in detail with reference to the accompanying drawings.

FIGS. 5 through 10 are sectional views illustrating a method for manufacturing a semiconductor device in accordance with an embodiment of the present invention. It is understood herein that the drawings are not necessarily to scale and in some instances proportions may have been exaggerated in order to more clearly depict certain features of the invention.

Figure 1:
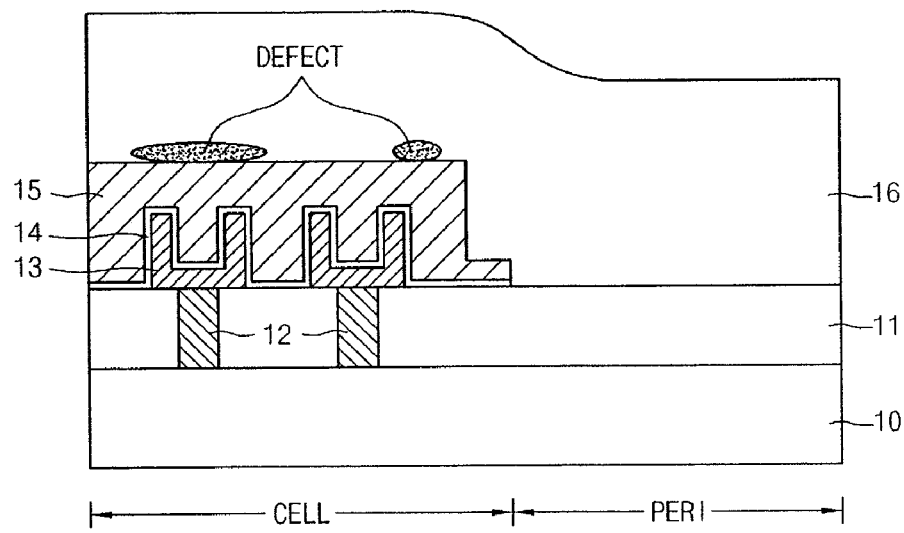
FIGS. 1 through 4 are sectional views illustrating conventional methods for manufacturing a semiconductor device and explaining problems caused therein.
Figure 2:
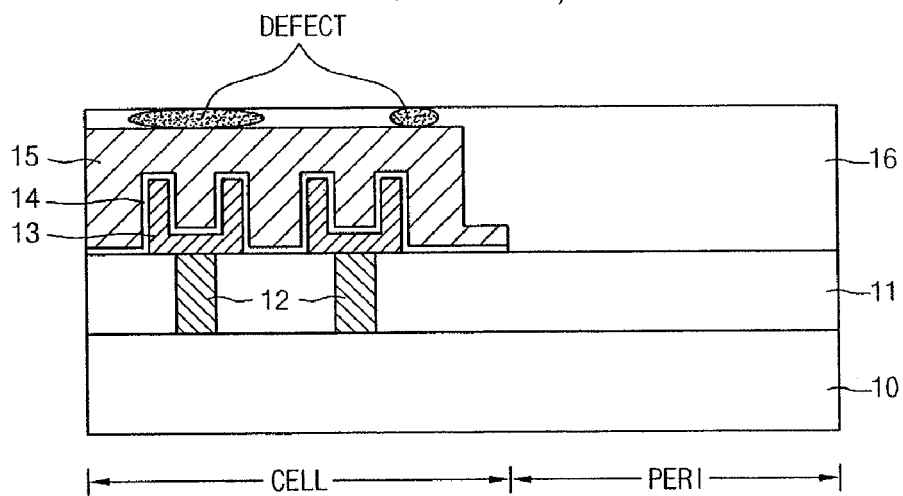
Figure 3:
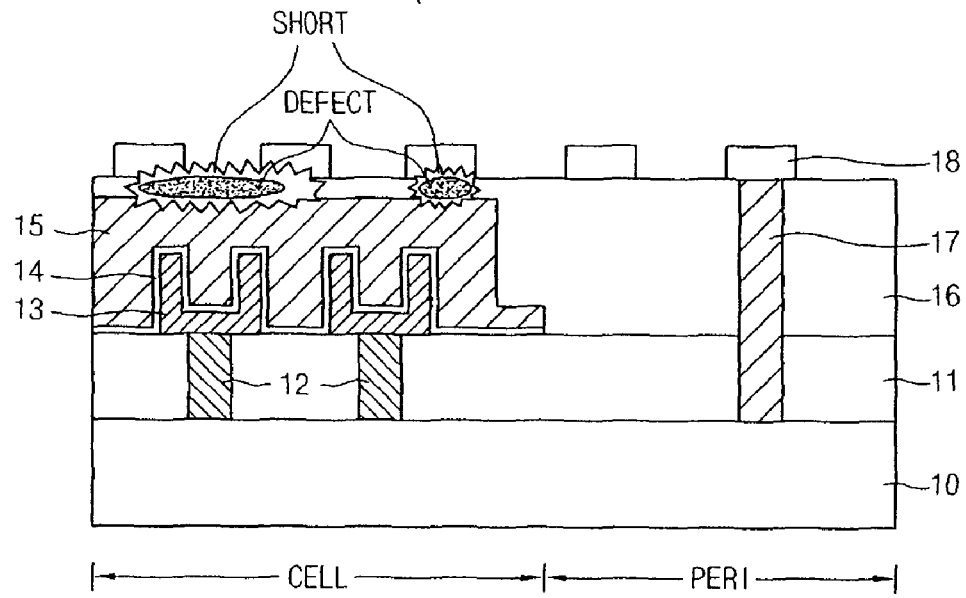
Figure 4:
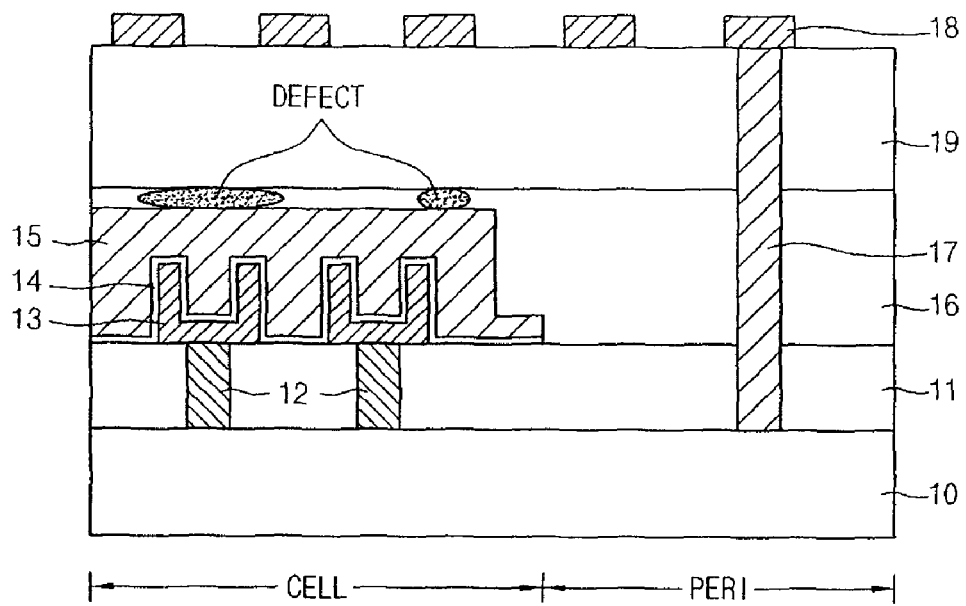
Figure 5:
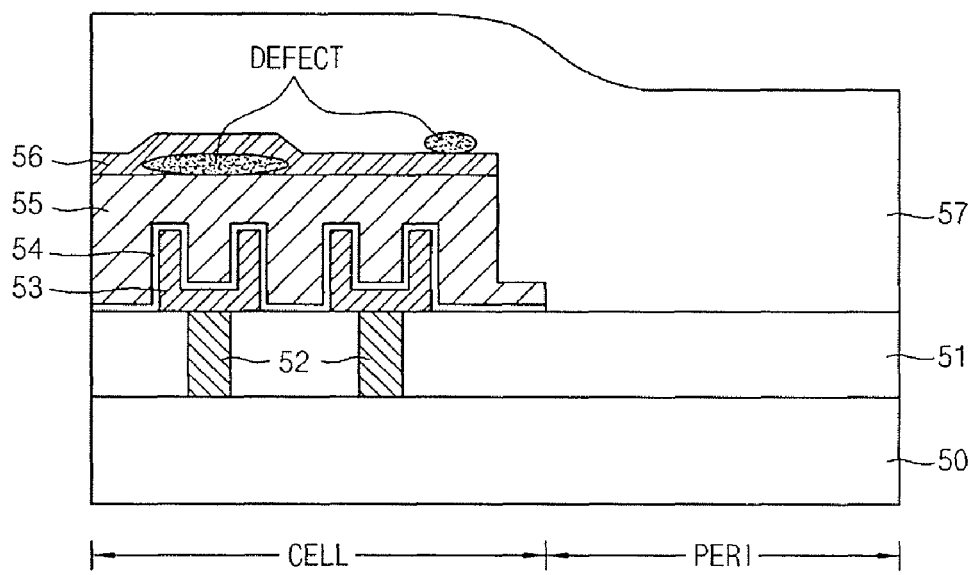
FIGS. 5 through 10 are sectional views illustrating a method for manufacturing a semiconductor device in accordance with an embodiment of the present invention.

Referring to FIG. 5, a first interlayer dielectric 51 is formed on a substrate 50 which has a cell region CELL and a peripheral region PERI. Storage node contacts 52 are formed through the first interlayer dielectric 51 in the cell region CELL to be electrically connected with the substrate 50.

While not shown in the drawing, it is understood that an underlying structure in the substrate 50 can include any number of different components such as those including isolation layers, gates, bit lines, and so forth formed in and on the substrate 50.

In succession, storage electrodes 53 are formed on the storage node contacts 52.

The storage electrodes 53 can have a three-dimensional shape such as of a cylinder. In this case, the storage electrodes 53 can be formed in a manner such that a sacrificial oxide layer (not shown) is formed on the first interlayer dielectric 51, trenches are defined by etching the sacrificial oxide layer, the storage electrodes 53 are formed in the trenches, and the sacrificial oxide layer used as a mold is removed through a full dip-out process.

Then, a dielectric layer 54, a plate electrode 55 and a sacrificial layer 56 are deposited in the cell region CELL and the peripheral region PERI. The sacrificial layer 56, the plate electrode 55 and the dielectric layer 54 are patterned such that they remain only in the cell region CELL. As a consequence, capacitors, each of which is composed of the storage electrode 53, the dielectric layer 54 and the plate electrode 55, are formed in the cell region CELL.

The plate electrode 55 can have the stack structure of a polysilicon layer and a nitride layer or the stack structure of silicon germanium (SiGe) and an aluminum oxide layer ($Al_2O_3$).

The sacrificial layer 56 can be formed using a material which has different etching selectivity from the plate electrode 55. For example, the sacrificial layer 56 can comprise at least one of a tungsten (W) layer, a titanium nitride (TiN) layer or a titanium (Ti) layer. It is preferred that the sacrificial layer 56 be formed of tungsten having no contamination issue.

While forming the capacitors, unwanted defects DEFECT are produced on the plate electrode 55 and/or the sacrificial layer 56. In the event that a defect DEFECT is produced on the plate electrode 55, the sacrificial layer 56 placed over the defect DEFECT protrudes upward due to the presence of the defect DEFECT.

In succession, a second interlayer dielectric 57 is formed on the entire surface.

The second interlayer dielectric 57 can be formed of an oxide-based material.

Due to the presence of the capacitors formed in the cell region CELL, the second interlayer dielectric 57 is formed having a step portion between the cell region CELL and the peripheral region PERI.

Figure 6:
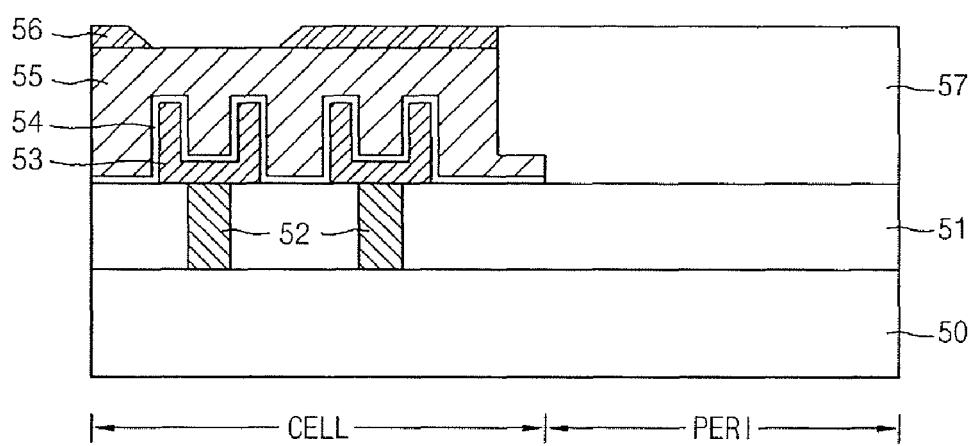

Referring to FIG. 6, by conducting a polishing process using the sacrificial layer 56 as a barrier, the defects DEFECT are removed and the second interlayer dielectric 57 is planarized in the peripheral region PERI.

A CMP process can be employed as the polishing process.

The defect DEFECT produced on the sacrificial layer 56 is removed by being polished during the polishing process. The protruding portion of the sacrificial layer 56 which protrudes due to the presence of the defect DEFECT produced on the plate electrode 55 is also removed by being polished. The defect DEFECT produced on the plate electrode 55 and exposed due to the removal of the protruding portion of the sacrificial layer 56 is released from the plate electrode 55 while conducting the polishing process.

Figure 11:
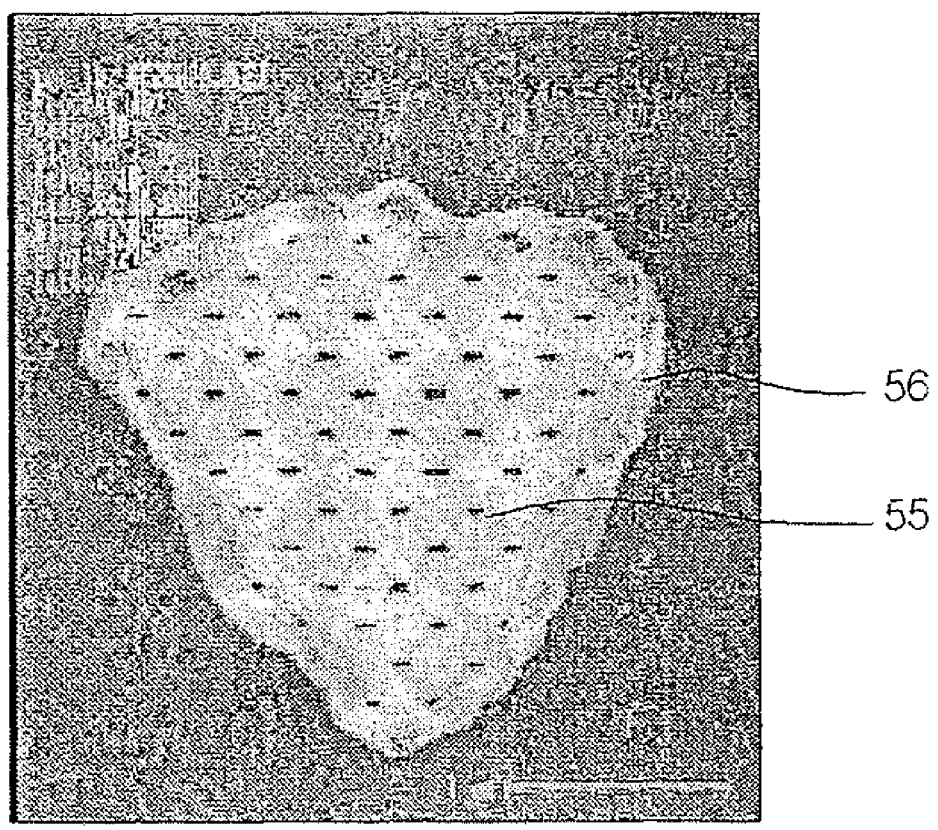
FIG. 11 is a photograph showing a surface after a polishing process is conducted according to the present invention.

FIG. 11 is a photograph showing a surface after the polishing process is conducted.

Referring now to FIG. 11, it can be observed that a defect-free clean surface removed with the defects DEFECT through the polishing process was obtained.

In particular, as defects DEFECT produced on the plate electrode 55 are released while conducting the polishing process, it can be observed that the plate electrode 55 is exposed where the defects DEFECT existed.

This means that not only the defect DEFECT produced on the sacrificial layer 56 but also the defect DEFECT produced on the plate electrode 55 are removed through the polishing process.

Thereafter, a post cleaning process is conducted. The post cleaning process can be conducted in situ with the polishing process.

Figure 7:
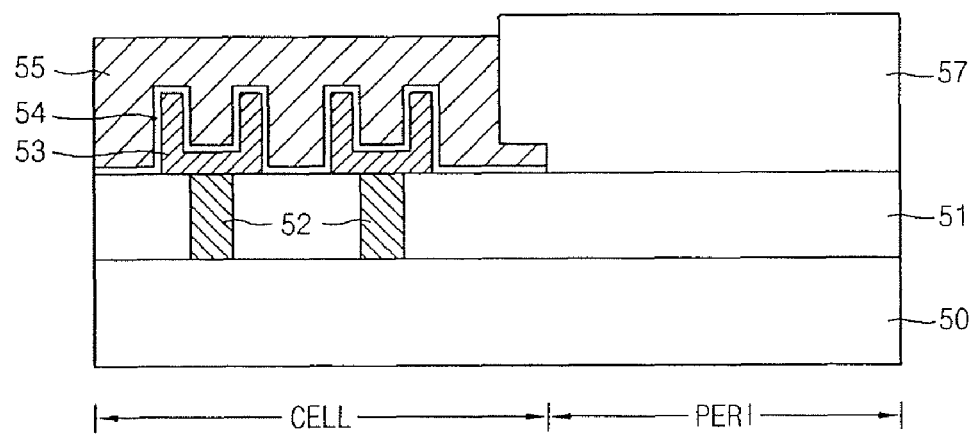

Referring to FIG. 7, the sacrificial layer 56 is removed.

When removing the sacrificial layer 56, a wet etching process or a dry etching process can be employed.

In the case where the wet etching process is employed, an etching solution containing SC-1($NH_4OH+H_2O_2+H_2O$) or piranha ($H_2SO_4+H_2O_2$) can be used.

The process for removing the sacrificial layer 56 can be conducted in situ with the CMP process and the post cleaning process.

The process for removing the sacrificial layer 56 can be conducted in a cleaner which is disposed in CMP equipment or in a wet bath which is used in the post cleaning process.

When conducting the process for removing the sacrificial layer 56, due to the difference in etching selectivity between the second interlayer dielectric 57 and the sacrificial layer 56, the second interlayer dielectric 57 in the peripheral region PERI is not etched, and only the sacrificial layer 56 in the cell region CELL is selectively removed.

Figure 8:
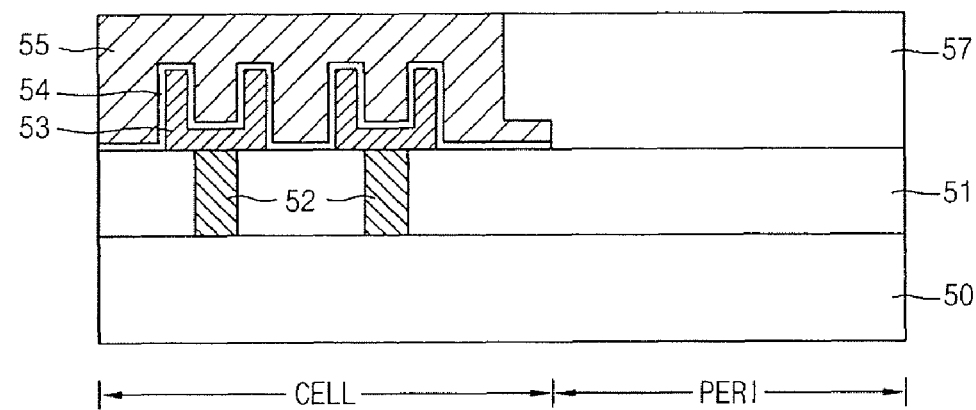

Referring to FIG. 8, by etching the second interlayer dielectric 57 in the peripheral region PERI, the step portion which is formed between the cell region CELL and the peripheral region PERI due to the removal of the sacrificial layer 56 is removed.

When etching the second interlayer dielectric 57, a wet etching process or a dry etching process can be employed.

In the case where the wet etching process is employed, an etching solution containing BOE (buffer oxide etchant) or HF can be used.

When etching the second interlayer dielectric 57, due to the difference in etching selectivity between the second interlayer dielectric 57 and the plate electrode 55, the plate electrode 55 in the cell region CELL is not etched, and only the second interlayer dielectric 57 in the peripheral region PERI is selectively etched.

The process for etching the second interlayer dielectric 57 can be conducted in situ with the CMP process, the post cleaning process, and the process for removing the sacrificial layer 56 in the same equipment.

If the step portion which is formed between the cell region CELL and the peripheral region PERI due to the removal of the sacrificial layer 56 is so small that no influence is exerted on subsequent processes, the process illustrated in FIG. 8 can be omitted.

Figure 9:
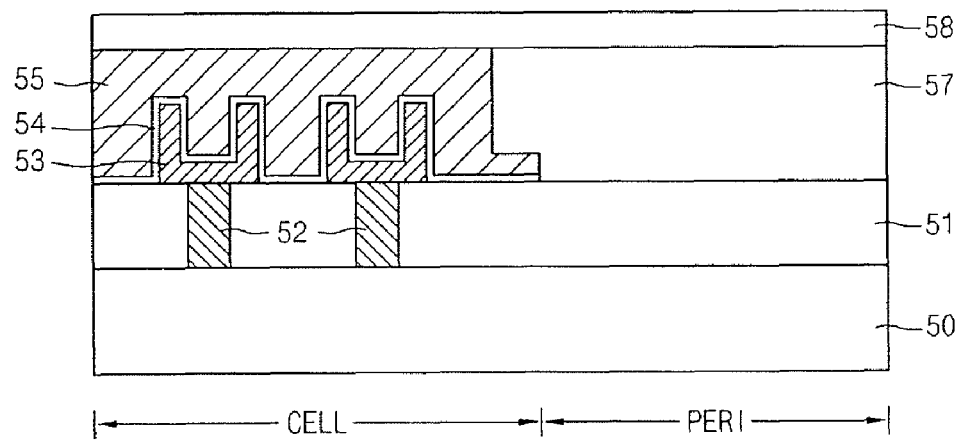

Referring now to FIG. 9, a third interlayer dielectric 58 is formed in the cell region CELL and the peripheral region PERI.

The third interlayer dielectric 58 can be formed of an to oxide-based material.

Since the third interlayer dielectric 58 is formed in the state in which the second interlayer dielectric 57 on the plate electrode 55 is completely removed, an increase in thickness is not caused by the formation of the third interlayer dielectric 58.

Figure 10:
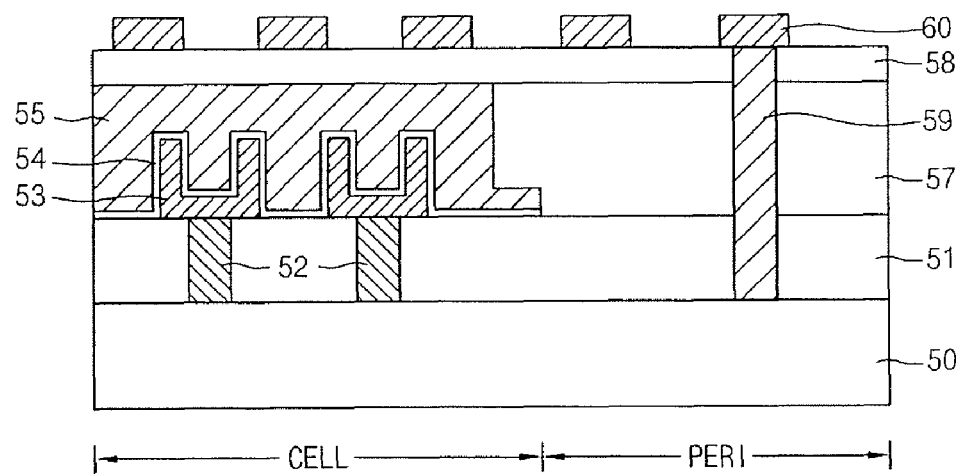

Referring now to FIG. 10, a contact plug 59 is formed through the third, second and first interlayer dielectrics 58, 57 and 51 in the peripheral region PERI to be electrically connected with the substrate 10 in the peripheral region PERI, and metal lines 60 are formed in the cell region CELL and the peripheral region PERI.

As is apparent from the above description, since the sacrificial layer 56 is formed on the capacitors and the polishing process is conducted using the sacrificial layer 56 as a barrier so that the defects DEFECT produced while forming the capacitors are removed, it is possible to protect against DC failure from being caused in that short circuits occur between the capacitors and the metal lines 60 or between the metal lines 60 due to the presence of the defects DEFECT.

Also, since the metal lines 60 are formed on the third interlayer dielectric 58 which does not substantially have any scratches produced by the CMP process, it is possible to protect against DC failures from being caused in that short circuits occur between the metal lines 60 because a metal layer used to form the metal lines 60 remains in the scratches produced while conducting the CMP process.

Further, since the height of an interlayer dielectric does not increase, it is possible to prevent the resistance of the contact plug 59 from increasing and contact holes from being insufficiently opened due to increase in the height of the interlayer dielectric.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:

depositing a sacrificial layer over a cell region and over a peripheral region of a substrate in which the cell region includes capacitors on a first interlayer dielectric wherein defects occur on capacitors and occur on the sacrificial layer;

removing selectively the sacrificial layer from the peripheral region such that the sacrificial layer remains over the cell region;

forming a second interlayer dielectric over the remaining sacrificial layer and over the peripheral region;

polishing down the second interlayer dielectric by using the remaining sacrificial layer as a barrier such that the defects on the capacitors and on the sacrificial layer are substantially removed and such that the second interlayer dielectric in the peripheral region is substantially planarized with the remaining sacrificial layer;

etching away the remaining sacrificial layer; and forming a third interlayer dielectric on the cell region and on the peripheral region.

2. The method according to claim 1, further comprises the step of partially etching away the second interlayer dielectric in the peripheral region, to substantially remove a resultant step between the cell region and the peripheral region brought about by the removal of the remaining sacrificial layer.

3. The method according to claim 2, wherein the step of partially etching away the second interlayer dielectric is implemented using either a wet etching process or a dry etching process.

4. The method according to claim 3, wherein the wet etching process is conducted using an etching solution containing BOE (Buffer Oxide Etchant) or HF.

5. The method according to claim 1, further comprising:

forming storages node contacts and storage electrodes of the capacitors in the cell region;

depositing a capacitor dielectric layer over the storage electrodes of the capacitors, depositing a plate electrode layer over the cell region and over the peripheral region such that the plate electrode covers the capacitors; and removing the sacrificial layer, the plate electrode layer and the capacitor dielectric layer in the peripheral region.

6. The method according to claim 1, wherein the remaining sacrificial layer is etched away more easily than a plate electrode of the capacitors.

7. The method according to claim 6, wherein the plate electrode comprises a polysilicon layer and nitride layer.

8. The method according to claim 6, wherein the plate electrode comprises a stack structure of silicon germanium (SiGe) and an aluminum oxide layer ($Al_2O_3$).

9. The method according to claim 6, wherein the sacrificial layer comprises at least one of a tungsten layer, a titanium nitride layer and a titanium layer.

10. The method according to claim 1, wherein the polishing step comprises a CMP process.

11. The method according to claim 1, wherein the remaining sacrificial layer protrudes above defects on the capacitors such that the protruding sacrificial layer above the defects and the underlying defects are substantially removed by the polishing step.

12. The method according to claim 1, wherein the step of removing selectively the sacrificial layer from the peripheral region is implemented using either a wet etching process or a dry etching process.

13. The method according to claim 12, wherein the wet etching process is conducted using either an SC-1 etching solution ($NH_4OH+H_2O_2+H_2O$) or piranha or a piranha etching solution ($H_2SO_4+H_2O_2$).

14. The method according to claim 1, wherein the step of etching away the remaining sacrificial layer is conducted using either an SC-1 etching solution ($NH_4OH+H_2O_2+H_2O$) or piranha or a piranha etching solution ($H_2SO_4+H_2O_2$).

15. The method according to claim 1, the method further comprises the steps of:

forming a contact plug through the first, second, and third interlayer dielectrics in the peripheral region that electrically couple to the substrate; and forming metal lines on the third interlayer dielectric in the cell region and the peripheral region.

* * * * *